(12) United States Patent
Kim et al.

(10) Patent No.: US 10,741,737 B2
(45) Date of Patent: Aug. 11, 2020

(54) LIGHT EMITTING DEVICE PACKAGE

(71) Applicant: Samsung Electronics Co., Ltd., Suwon-si, Gyeonggi-do (KR)

(72) Inventors: Mi Hyun Kim, Seoul (KR); Young Hwan Park, Yongin-si (KR); Sam Mook Kang, Hwaseong-si (KR); Joo Sung Kim, Seongnam-si (KR); Jong Uk Seo, Hwaseong-si (KR); Young Jo Tak, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/018,542

(22) Filed: Jun. 26, 2018

(65) Prior Publication Data
US 2019/0189877 A1    Jun. 20, 2019

(30) Foreign Application Priority Data
Dec. 14, 2017    (KR) ........................ 10-2017-0172165

(51) Int. Cl.
| | |
|---|---|
| *H01L 33/62* | (2010.01) |
| *H01L 33/64* | (2010.01) |
| *H01L 33/38* | (2010.01) |
| *H01L 33/40* | (2010.01) |
| *H01L 33/60* | (2010.01) |

(52) U.S. Cl.
CPC ............ *H01L 33/62* (2013.01); *H01L 33/387* (2013.01); *H01L 33/405* (2013.01); *H01L 33/60* (2013.01); *H01L 33/64* (2013.01); *H01L 33/642* (2013.01)

(58) Field of Classification Search
CPC ..... H01L 33/387; H01L 33/405; H01L 33/62; H01L 33/64
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |

(Continued)

FOREIGN PATENT DOCUMENTS

| | | |
|---|---|---|
| KR | 10-0629593 B1 | 9/2006 |
| KR | 10-0699161 A1 | 3/2007 |
| KR | 10-2014-0115590 A | 10/2014 |

*Primary Examiner* — Mohammed Shamsuzzaman
(74) *Attorney, Agent, or Firm* — Lee IP Law, PC (57) ABSTRACT

A light emitting device package includes a package substrate and a submount on the package substrate. An upper surface of the submount includes a central region, first and second base regions spaced from the package substrate, relative to the central region, and a sloped region between the central region and the first and second base regions. A light emitting device chip is in the central region. A first electrode layer is between the central region and the light emitting device chip and extends onto the sloped region and the first base region. A second electrode layer is between the central region and the light emitting device chip, extends onto the sloped region and the second base region, and is spaced apart from the first electrode layer. First and second reflective layers are on the first and second electrode layers, respectively, and overlap the sloped region.

11 Claims, 5 Drawing Sheets

(56) References Cited

U.S. PATENT DOCUMENTS

| | | |
|---|---|---|
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,372,082 B2 | 5/2008 | Kim et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,112,126 B2 * | 8/2015 | Moon ............... G02F 1/133603 |
| 9,240,524 B2 | 1/2016 | Park et al. |
| 9,585,254 B2 * | 2/2017 | Nishimura ............. H05K 1/183 |
| 2005/0274959 A1 | 12/2005 | Kim et al. |
| 2009/0101897 A1 * | 4/2009 | Murphy ................. H01L 23/60 257/48 |
| 2009/0267085 A1 * | 10/2009 | Lee .......................... F21K 9/00 257/88 |
| 2011/0163338 A1 * | 7/2011 | Won ...................... H01L 33/46 257/98 |
| 2012/0319152 A1 * | 12/2012 | Park ...................... H01L 33/62 257/98 |
| 2015/0270461 A1 | 9/2015 | Fujimori et al. |
| 2016/0242292 A1 * | 8/2016 | Nishimura ............. H05K 1/183 |

* cited by examiner

LIGHT EMITTING DEVICE PACKAGE

CROSS-REFERENCE TO RELATED APPLICATION

Korean Patent Application No. 10-2017-0172165 filed on Dec. 14, 2017 in the Korean Intellectual Property Office, and entitled: "Light Emitting Device Package," is incorporated by reference herein in its entirety.

BACKGROUND

1. Field

Embodiments relate to a light emitting device package, and more particularly to a light emitting device package including a submount.

2. Description of the Related Art

Recently, light emitting device packages including an ultraviolet light emitting device used in various applications, e.g., sterilizing and disinfecting, UV curing, and the like, have been developed. Such an ultraviolet light emitting device has low light extraction efficiency, as compared with a visible light emitting device, e.g., a blue light emitting device, a green light emitting device, or a red light emitting device.

SUMMARY

According to an aspect, a light emitting device package is provided. The light emitting device package includes a package substrate and a submount on the package substrate. An upper surface of the submount includes a central region, first and second base regions spaced from the package substrate, relative to the central region, and a sloped region between the central region and the first and second base regions. A light emitting device chip is disposed in the central region. A first electrode layer is interposed between the central region and the light emitting device chip and extends onto the sloped region and the first base region. A second electrode layer is interposed between the central region and the light emitting device chip, extends onto the sloped region and the second base region, and is spaced apart from the first electrode layer. A first reflective layer is disposed on the first electrode layer. The first reflective layer overlaps the sloped region. A second reflective layer is disposed on the second electrode layer. The second reflective layer overlaps the sloped region.

According to an aspect, a light emitting device package is provided. The light emitting device package includes a package body including a package substrate and a side portion on the edge region of the package substrate. A submount is disposed on the package substrate. An upper surface of the submount includes a central region, a sloped region extending from the central region and surrounding the central region, and first and second base regions extending from the sloped region in a direction of the side portion. A light emitting device chip is disposed in the central region. A first electrode layer is interposed between the central region and the light emitting device chip and extends onto the sloped region and the first base region. A second electrode layer is interposed between the central region and the light emitting device chip, extends onto the sloped region and the second base region, and is spaced apart from the first electrode layer. A first reflective layer is disposed on the first electrode layer. A second reflective layer is disposed on the second electrode layer. The first and second reflective layers overlap the sloped region.

According to an aspect, a light emitting device package is provided. The light emitting device package includes a package body including a package substrate and a side portion on the edge region of the package substrate. A cover, covering an upper side of the package body, is provided. A submount is disposed in a space between the package substrate and the cover. An upper surface of the submount includes a central region, a sloped region extending from the central region and surrounding the central region, and first and second base regions extending from the sloped region in a direction of the side portion. A light emitting device chip is disposed in the central region. The light emitting device chip is disposed below the cover. A first electrode layer is interposed between the central region and the light emitting device chip and extends onto the sloped region and the first base region. A second electrode layer is interposed between the central region and the light emitting device chip, extends onto the sloped region and the second base region, and is spaced apart from the first electrode layer. A first reflective layer is disposed on the first electrode layer. A second reflective layer is disposed on the second electrode layer. The first and second reflective layers overlap the sloped region.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, example embodiments will be described with reference to the accompanying drawings.

Figure 1:
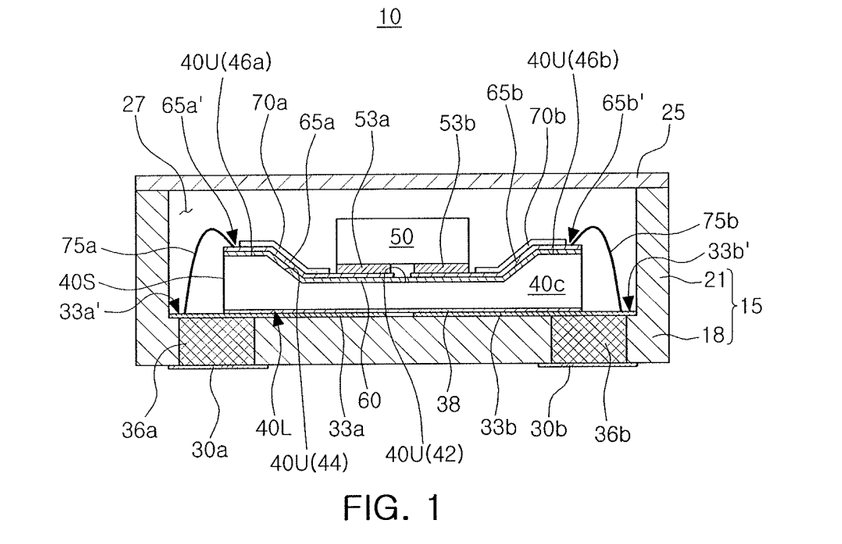
FIG. 1 illustrates a schematic cross-sectional view of a light emitting device package according to an example embodiment.
Figure 2:
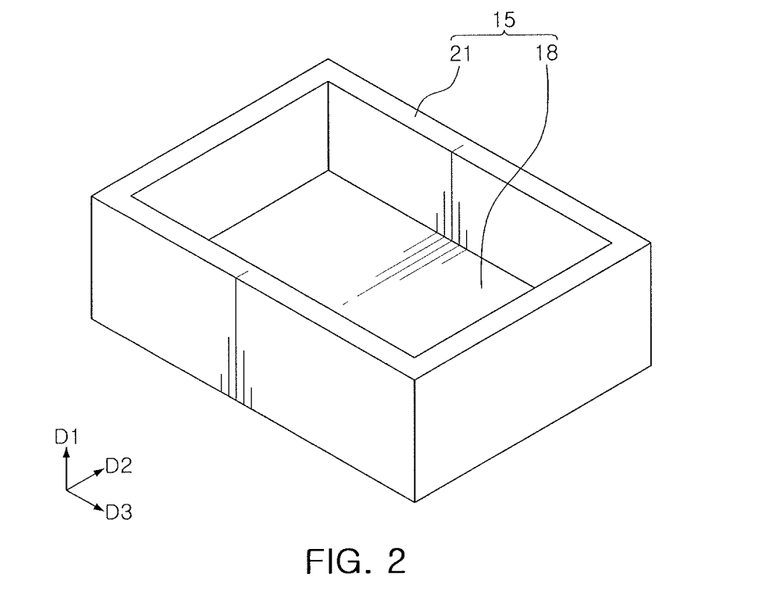
FIG. 2 illustrates a schematic perspective view of a package body of a light emitting device package according to an example embodiment.
Figure 3:
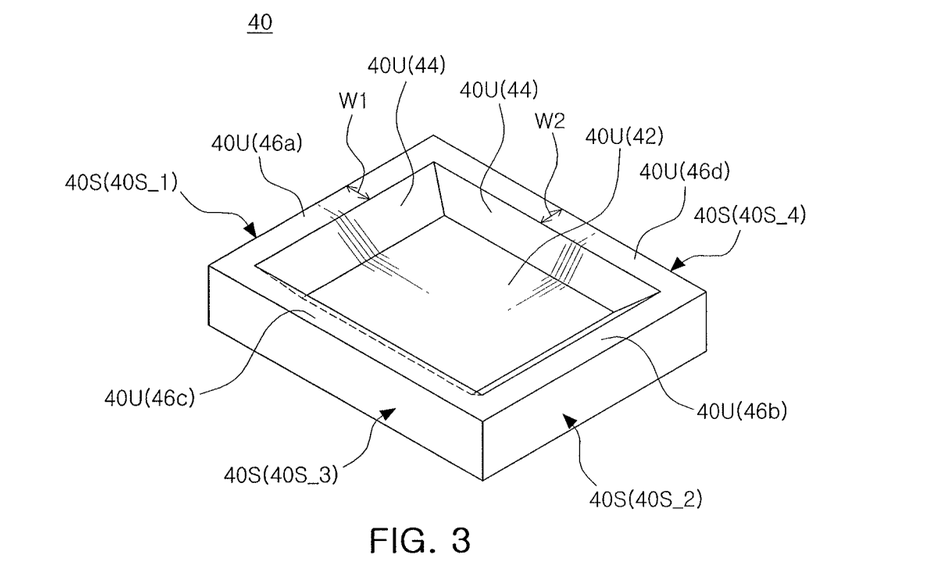
FIG. 3 illustrates a schematic perspective view of a submount of a light emitting device package according to an example embodiment.
Figure 4:
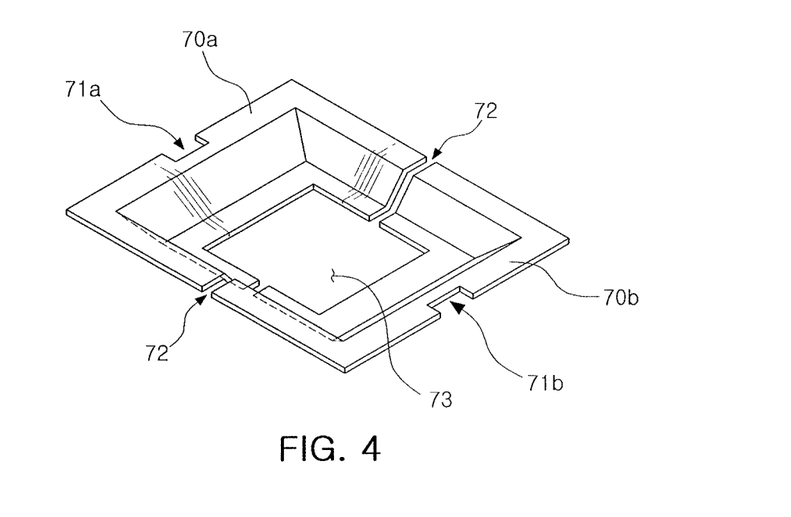
FIG. 4 illustrates a schematic perspective view of reflective layers of a light emitting device package according to an example embodiment.

FIG. 1 is a cross-sectional view schematically illustrating a light emitting device package according to an example embodiment. FIG. 2 is a perspective view schematically illustrating a package body 15 of a light emitting device package 10 according to an example embodiment. FIG. 3 is a perspective view schematically illustrating a submount 40 of the light emitting device package 10 according to an example embodiment. FIG. 4 is a perspective view schematically illustrating reflective layers 70a and 70b of the light emitting device package 10 according to an example embodiment.

Referring to FIGS. 1, 2, 3 and 4, a light emitting device package 10 according to an example embodiment includes a package body 15, a submount 40, a light emitting device chip 50, and a cover 25 stacked along a first direction D1. The package body 15 may include a package substrate 18 and a side portion 21 on the edge region of the package body 15. The cover 25 may cover the package body 15. The cover 25 may be formed of a material that is transparent to wavelengths output by the light emitting device chip 50, e.g., translucent quartz or glass. The cover 25 may be coupled to the side portion 21 to cover the package body 15. In other words, along with the package substrate 18, the cover 25 and the side portion 21 may house, e.g., completely surround the submount 40 and the light emitting device chip 50.

The light emitting device package 10 according to an example embodiment may include a first package pad 30a and a second package pad 30b on a lower surface of the package substrate 18 and spaced apart from each other along a second direction D2, a first lower electrode 33a and a second lower electrode 33b on an upper surface of the package substrate 18 and spaced apart from each other along the second direction D2, and a first connection pattern 36a and a second connection pattern 36b penetrating through the package substrate 18 along the first direction D1 and spaced apart from each other along the second direction D2.

The first lower electrode 33a and the second lower electrode 33b may correspond to the first package pad 30a and the second package pad 30b, e.g., may overlap along the first direction D1. The first lower electrode 33a and the second lower electrode 33b may extend further along the second direction D2 towards each other than the first package pad 30a and the second package pad 30b, The first connection pattern 36a may electrically connect the first package pad 30a and the first lower electrode 33a, and the second connection pattern 36b may electrically connect the second package pad 30b and the second lower electrode 33b.

The submount 40 may be on the package substrate 18, e.g., on the upper surface thereof. The submount 40 may be on the first and second lower electrodes 33a and 33b in the package substrate 18. The submount 40 may include a lower surface 40L, a side surface 40S, and an upper surface 40U. The lower surface 40L of the submount 40 may face the package substrate 18. The side surface 40S of the submount 40 may face the side portion 21. The upper surface 40U of the submount 40 may include a region facing the cover 25.

The upper surface 40U of the submount 40 may include a central region 42, first and second base regions 46a and 46b distant from the package substrate 18, e.g., spaced from the package substrate 18 along the first direction D1, relative to the central region 42, and sloped regions 44 between the central region 42 and the first and second base regions 46a and 46b.

In an example, the central region 42 and the first and second base regions 46a and 46b may be parallel to an upper surface of the package substrate 18. In an example, the sloped region 44 may surround the central region 42, e.g., may extend along the first direction D1 from portions in the second and third direction D2 and D3 of the central region 42. In an example, the sloped region 44 may extend from the central region 42 and surround the central region 42, and the first and second base regions 46a and 46b may extend from the sloped region 44, e.g., along the second and third directions D2 and D3 away from the central region 42.

In an example, a planar shape of the submount 40 may be rectangular. Alternatively, the planar shape of the submount 40 may be a circular shape, an oval shape, or a polygonal shape such as a hexagonal shape. In an example, a planar shape of the central region 42 may be rectangular. Alternatively, the central region 42 may be circular or elliptical or may have a polygonal shape, e.g., a hexagonal shape.

In an example, the sloped region 44 may be sloped from the central region 42 toward the first and second base regions 46a and 46b at an angle of about 0.5° to about 30° relative to the first direction D1.

In an example, the side surface 40S of the submount 40 may include a first side surface 40S_1 and a second side surface 40S_2 facing each other and a third side surface 40S_3 and a fourth side surface 40S_4 facing each other. In an example, the first base region 46a may be adjacent to the first side surface 40S_1 and the second base region 46b may be adjacent to the second side surface 40S_2.

In an example, the upper surface 40U of the submount 40 may include an upper end portion. The upper end portion may include third and fourth upper end portions 46c and 46d respectively adjacent to the third and fourth side surfaces 40S_3 and 40S_4.

In an example, the first and second base regions 46a and 46b may be part of the upper end portions of the submount 40. In the submount 40, the first base region 46a adjacent to the first side surface 40S_1 may be defined as a first end portion, the second base region 46b adjacent to the second side surface 40S_2 may be defined as a second upper end portion, an upper end portion adjacent to the third side surface 40S_3 may be defined as a third upper end portion 46c, and an upper end portion adjacent to the fourth side surface 40S_4 may be defined as a fourth upper end portion 46d. Accordingly, the submount 40 may include the first to fourth upper end portions 46a, 46b, 46c, and 46d.

In an example, the submount 40 may be formed of silicon. Alternatively, the submount 40 may be formed of a metallic material, e.g., aluminum nitride (AlN) or aluminum (Al).

The light emitting device package 10 according to an example embodiment may include an adhesive member 38 adhered to a lower surface 40L of the submount 40. The adhesive member 38 is interposed between the submount 40 and the first and second lower electrodes 33a and 33b to serve to fix or adhere the submount 40 to the first and second lower electrodes 33a and 33b. Accordingly, the adhesive member 38 may separate and insulate the submount 40 from the first and second lower electrodes 33a and 33b.

The light emitting device package 10 according to an example embodiment includes an insulating layer 60 on the submount 40 and first and second electrode layers 65a and 65b on the insulating layer 60 and spaced apart from each other. The insulating layer 60 may be formed of an insulating material, e.g., a silicon oxide and/or a silicon nitride.

In an example, the insulating layer 60 may cover the upper surface 40U of the submount 40. In an example, the insulating layer 60 may cover the entire upper surface 40U of the submount 40 and may have a side surface self-aligned with a side surface of the submount 40.

The first electrode layer 65a may overlap a portion of the central region 42 of the submount 40 and extend to the sloped region 44 and the first base region 46a. The second electrode layer 65b may overlap a portion of the central region 42 of the submount 40 and extend to the sloped region 44 and the second base region 46b.

The light emitting device package 10 according to an example embodiment may include the light emitting device chip 50 in the central region 42 on the submount 40, a first chip pad 53a between the light emitting device chip 50 and the first electrode layer 65a, and a second chip pad 53b between the light emitting device chip 50 and the second electrode layer 65b.

In an example, the light emitting device chip 50 may be an ultraviolet light emitting device chip emitting light within an ultraviolet ray region. For example, a peak wavelength of the light emitting device chip 50 may include a deep ultraviolet (UV-C) of 300 nm or less.

In an example, the upper surface of the light emitting device chip 50 may be higher than the upper end portions of the submount 40 along the first direction D1. The first and second base regions 46a and 46b of the submount 40 may be closer to the package substrate 18 than the upper surface of the light emitting device chip 50.

The light emitting device package 10 according to an example embodiment may include a first reflective layer 70a on the first electrode layer 65a and on the sloped region 44, and a second reflective layer 70b on second electrode layer 65b and on the sloped region 44. The first and second reflective layers 70a and 70b may be spaced apart from each other, e.g., along the third direction D3, by a gap 72.

In an example, the first and second reflective layers 70a and 70b may extend from the portion overlapping the sloped region 44 to the central region 42 to overlap a portion of the central region 42. In an example, the first and second reflective layers 70a and 70b may extend from the portion overlapping the sloped region 44 to the upper end portion of the submount 40 to overlap a portion of the upper end portion of the submount 40.

In an example, the first and second electrode layers 65a and 65b may be formed of a material having higher electrical conductivity than that of the first and second reflective layers 70a and 70b, and the first and second reflective layers 70a and 70b may be formed of a material having reflectivity higher than that of the first and second electrode layers 65a and 65b. For example, the first and second electrode layers 65a and 65b may be formed of a highly electrically conductive material, e.g., gold (Au), or the like, and the first and second reflective layers 70a and 70b may be formed of a material having high reflectivity, e.g., Al, rhodium (Rh), ruthenium (Ru), and the like.

The first electrode layer 65a may include a first upper contact region 65a' extending from a region sandwiched between the submount 40 and the first reflective layer 70a toward the side portion 21. The second electrode layer 65b may include a second upper contact region 65b' extending from a region sandwiched between the submount 40 and the second reflective layer 70b toward the side portion 21.

In an example, the first reflective layer 70a may extend, on the sloped region 44, toward the central region 42 to overlap a portion of the central region 42 and extend, on the sloped region 44, toward the first base region 46a to overlap a portion of the first base region 46a. The second reflective layer 70b may extend, on the sloped region 44, toward the central region 42 to overlap a portion of the central region 42. In particular, the first and second reflective layers 70a and 70b may extend along a perimeter of the central region 42, e.g., other than the gap 72, such that an opening 73 between them provides sufficient room for the light emitting device chip 50, e.g., neither of the first second reflective layers 70a and 70b is in contact with the light emitting device chip 50.

The first reflective layer 70a may extend, on the sloped region 44, toward the first base region 46a to overlap a portion of the first base region 46a. The second reflective layer 70b may extend, on the sloped region 44, toward the second base region 46b to overlap a portion of the second base region 46b. For example, the first reflective layer 70a may have a first recess 71a (see FIG. 4) exposing the first upper contact region 65a' of the first electrode layer 65a on the first base region 46a, and the second reflective layer 70b may have a second recess 71b exposing the second upper contact region 65b' of the second electrode layer 65b on the second base region 46b. Other than these recesses 71a and 71b, and the gap 72, the first and second reflective layers 70a, 70b may completely overlap the first and second base regions 46a, 46b, respectively.

The first lower electrode 33a may include a first lower contact region 33a' extending from a region interposed between the submount 40 and the package substrate 18 in a direction of the side portion 21, e.g., away from the central region 42 along the second and third directions D2, D3. The second lower electrode 33b may include a second lower contact region 33b' extending from a region interposed between the submount 40 and the package substrate 18 in a direction of the side portion 21, e.g., away from the central region 42 along the second and third directions D2, D3.

The light emitting device package 10 may include a first bonding wire 75a connecting the first electrode layer 65a and the first lower electrode 33a, and a second bonding wire 75b connecting the second electrode layer 65b and the second lower electrode 33b.

In an example, the first bonding wire 75a, which is in contact with the first upper contact region 65a' of the first electrode layer 65a, extends along the first direction D1 towards the package substrate 18 to be in contact with the first lower contact region 33a' of the first lower electrode 33a. Accordingly, the first bonding wire 75a may electrically connect the first upper contact region 65a' of the first electrode layer 65a and the first lower contact region 33a' of the first lower electrode 33a. The second bonding wire 75b, which is in contact with the second upper contact region 65b' of the second electrode layer 65b, extends along the first direction D1 towards the package substrate 18 to be in contact with the second lower contact region 33b' of the second lower electrode 33b. Accordingly, the second bonding wire 75b may electrically connect the second upper contact region 65b' of the second electrode layer 65b and the second lower contact region 33b' of the second lower electrode 33a.

In an example, the package substrate 18 and/or the side portion 21 may be formed of a ceramic material. Alternatively, the package substrate 18 and/or the side portion 21 may include any one of a ceramic material and a metal material, or a combination thereof. For example, the package substrate 18 and/or the side portion 21 may be formed of any one of AlN, Al, silicon (Si), aluminum oxide ($Al_2O_3$), or boron nitride (BN), or a combination thereof. In an example, when the package substrate 18 includes a metal material, the metal material of the package substrate 18 may be spaced apart from the first and second package pads 30a and 30b, the first and second connection patterns 36a and 36b, and the first and second lower electrodes 33a and 33b. The package substrate 18 may include an insulating material between the first and second package pads 30a and 30b, the first and second connection patterns 36a and 36b, and the first and second lower electrodes 33a and 33b, and the metal material of package substrate 18.

As described above, the first and second reflective layers 70a and 70b, the first and second electrode layers 65a and 65b, electrically connected to the first and second chip pads 53a and 53b of the light emitting device chip 50, and the first and second bonding wires 75a and 75b in contact with the first and second upper contact regions 65a' and 65b' and the first and second lower contact regions 33a' and 33b', may be provided. The first and second electrode layers 65a and 65b, which may be formed of a conductive material having electrical conductivity higher than that of the first and second reflective layers 70a and 70b, may enhance electrical properties of the light emitting device package 10. The first and second reflective layers 70a and 70b, which may be formed of a material having reflectivity higher than that of the first and second electrode layers 65a and 65b, may enhance light extraction efficiency of the light emitting device package 10.

As described above, since the first and second reflective layers 70a and 70b may cover the sloped region 44, may extend from the sloped region 44 to the central region 42 to overlap a portion of the central region 42, and extend from the portion overlapping the sloped region 44 to the upper end portion of the submount 40 to overlap a portion of the upper end portion of the submount 40, the first and second reflective layers 70a and 70b may reflect a larger amount of light within an ultraviolet region emitted from the light emitting device chip 50. For example, the portions of the first and second reflective layers 70a and 70b which overlap the sloped region 44 and a portion of the central region 42 may reflect light directly emitted from the light emitting device chip 50 and re-reflect light which is reflected from the cover 25 after being emitted from the light emitting device chip 50. Also, the portions of the first and second reflective layers 70a and 70b overlapping portions of the upper end portion may re-reflect light reflected from the cover 25 after being emitted from the light emitting device chip 50.

Accordingly, since the first and second reflective layers 70a and 70b directly and indirectly reflect light of the ultraviolet region emitted from the light emitting device chip 50, light extraction efficiency may be increased. Also, the aforementioned submount 40 may dissipate heat generated by the light emitting device chip 50. Thus, the aforementioned submount 40 may increase heat dissipation efficiency of the light emitting device package 10. Therefore, according to the example embodiment, the light emitting device package 10 capable of increasing the efficiency of extracting light of the ultraviolet region emitted from the light emitting device chip 50 and the heat dissipation efficiency may be provided.

In an example, the first to fourth upper end portions 46a, 46b, 46c, and 46d of the submount 40 may surround the central region 42 and the sloped region 44, with the substantially the same width. For example, a width W1 along the third direction D3 of each of the first and second upper end portions 46a and 46b facing each other and a width W2 along the second direction D2 of each of the third and fourth upper end portions 46c and 46d facing each other with may be substantially equal. Alternatively, the shape of the first to fourth upper end portions 46a and 46b, 46c and 46d of the submount 40 may be varied.

Figure 5:
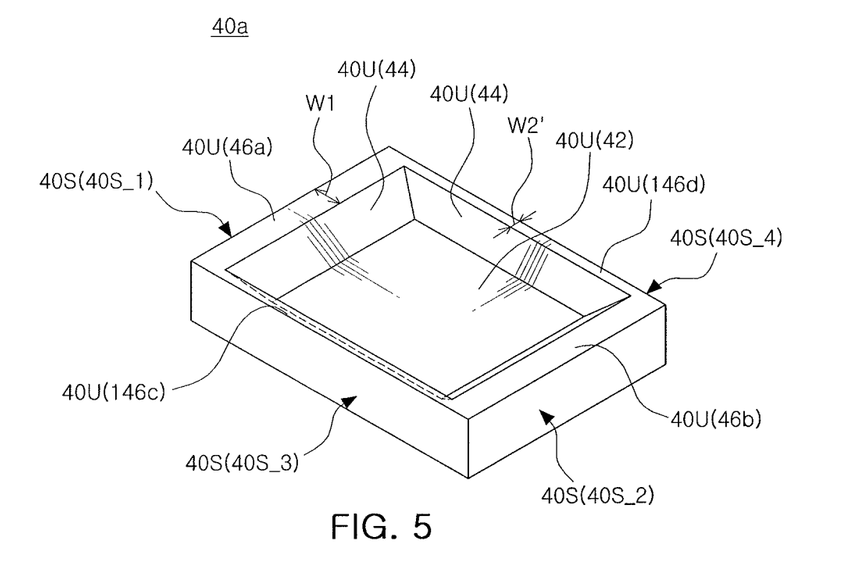
FIG. 5 illustrates a schematic perspective view of a modification of a submount of a light emitting device package according to an example embodiment.

Modifications of the first to fourth upper end portions 46a, 46b, 46c, and 46d of the submount 40 will be described with reference to FIGS. 5 and 6. FIG. 5 is a perspective view schematically illustrating a modification of the submount 40 of a light emitting device package according to an example embodiment, and FIG. 6 is a perspective view schematically illustrating another modification of the submount 40 of a light emitting device package according to the example embodiment.

Referring to FIG. 5, a submount 40a according to an example embodiment may have first to fourth side surfaces 40S_1, 40S_2, 40S_3, and 40S_4, which are the same as those described above with reference to FIGS. 1 to 4. The submount 40a may include the first upper end portion 46a adjacent to the first side surface 40S_1, the second upper end portion 46b adjacent to the second side surface 40S_2, a third upper end portion 146c adjacent to the third side surface 40S_3, and a fourth upper end portion 146d adjacent to the fourth side surface 40S_4. A width W2' along the second direction D2 of each of the third and fourth upper end portions 146c and 146d may be smaller than a width W1 along the third direction D3 of each of the first and second upper end portions 46a and 46b.

Figure 6:
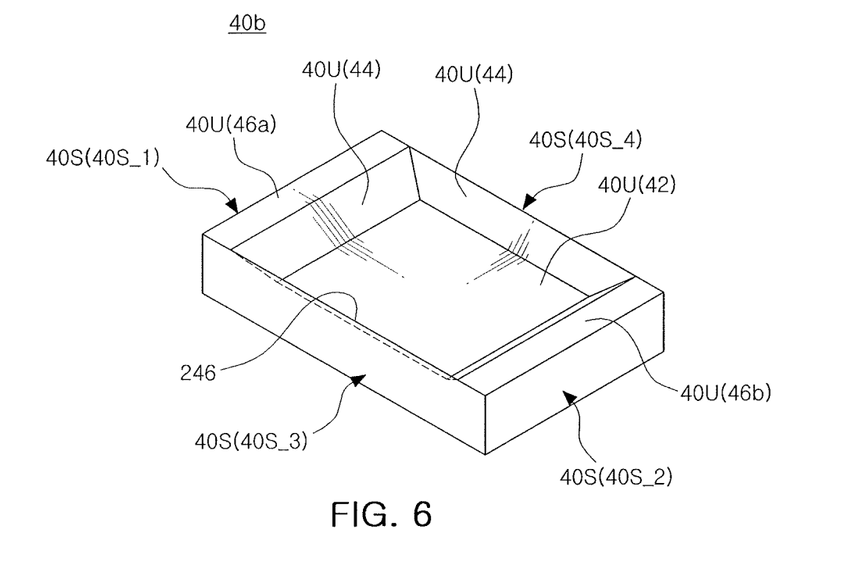
FIG. 6 illustrates a schematic perspective view of another modification of a submount of a light emitting device package according to the example embodiment.

Referring to FIG. 6, a submount 40b according to an example embodiment may have first to fourth side surfaces 40S_1, 40S_2, 40S_3, and 40S_4, which are the same as those described above with reference to FIGS. 1 to 4. The submount 40b may have the first upper end portion 46a adjacent to the first side surface 40S_1 and the second upper end portion 46b adjacent to the second side surface 40S_2. The submount 40b may have upper end portions 246 where the third and fourth side surfaces 40S_3 and 40S_4 and the sloped region 44 meet each other. Accordingly, each of the upper end portions 246, at which the third and fourth side surfaces 40S_3 and 40S_4 and the sloped region 44 meet, may have a line shape when viewed from the plane, e.g., may have a minimal width along the second direction.

Figure 7:
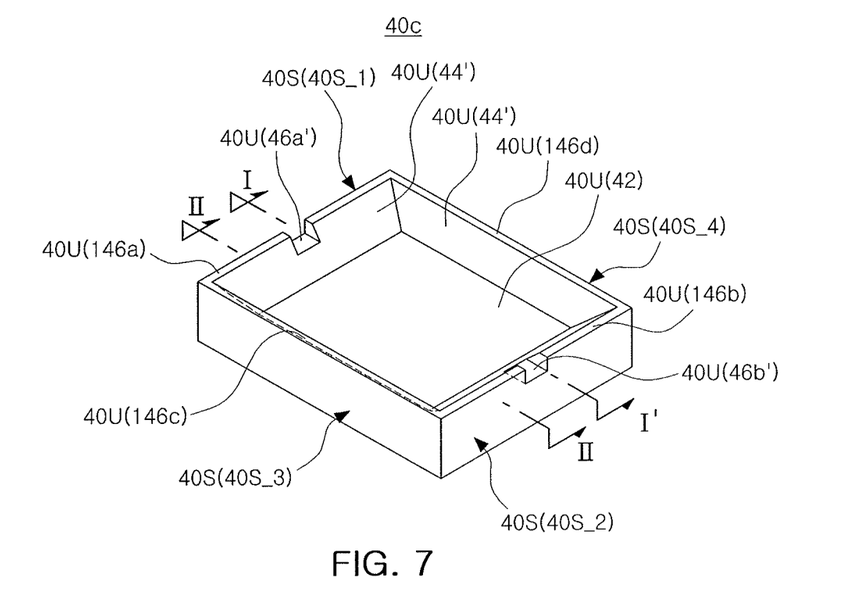
FIG. 7 illustrates a schematic perspective view another modification of a submount of a light emitting device package according to the example embodiment.

Another modification of the submount will be described with reference to FIG. 7. FIG. 7 is a perspective view schematically illustrating another modification of the submount of the light emitting device package according to an example embodiment.

Referring to FIG. 7, a submount 40c according to an example embodiment may have side surfaces 40S including first and second side surfaces 40S_1 and 40S_2 facing each other, and third and fourth side surfaces 40S_3 and 40S_3 facing each other.

An upper surface 40U of the submount 40c may include the central region 42, a sloped region 44' surrounding the central region 42, and upper end portions between the sloped region 44' and the side surface 40S. The upper end portions may be coplanar.

The upper end portions may include first and second upper end portions 146a and 146b adjacent to the first and second side surfaces 40S_1 and 40S_2, and third and fourth upper end portions 146c and 146d adjacent to the third and fourth side surfaces 40S_3 and 40S_4. For example, the first and second upper end portions 146a and 146b and the third and fourth upper end portions 146c and 16d may be coplanar.

The upper surface 40U of the submount 40c may include a first base region 46a', which is a bottom region of a region recessed along the first direction D1 from a portion of the first upper end portion 146a and a second base region 46b', which is a bottom region of a region recessed along the first direction D1 from a portion of the second upper end portion 146b. Accordingly, a portion of the upper end portion may include the recessed regions, and the first and second base regions 46a' and 46b' may be bottom regions of the recessed regions.

A width of each of the first and second base regions 46a' and 46b' may be greater than a width of each of the first and second upper end portions 146a and 146b, e.g., a width along the third direction D3 may increase along the first direction D1 from the first and second upper end portions 146a and 146b to the first and second base regions 46a' and 46b'.

Figure 8A:
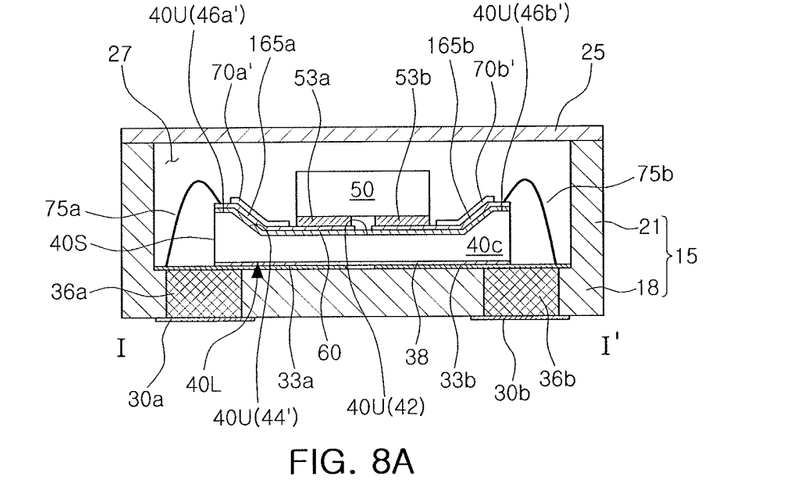
FIGS. 8A and 8B illustrate schematic cross-sectional views of a modification of a light emitting device package according to an example embodiment.
Figure 8B:
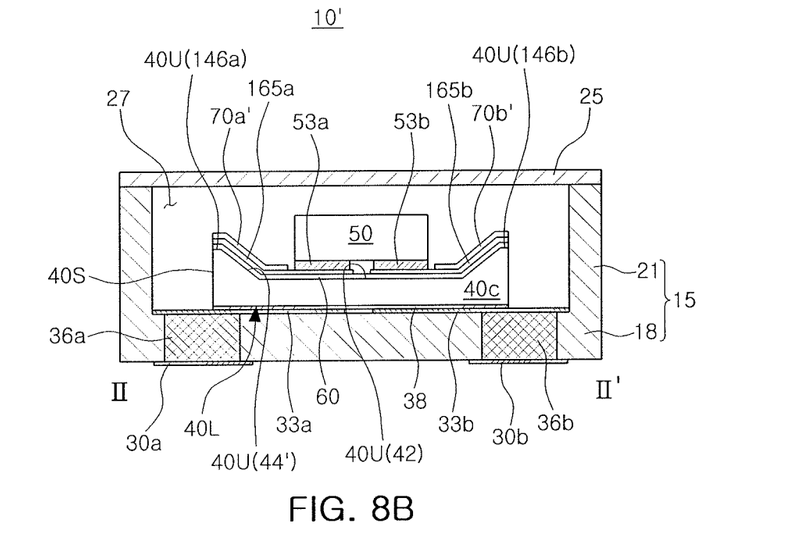

Examples of a light emitting device package 10' including the submount 40c will be described with reference to FIGS. 8A and 8B. FIGS. 8A and 8B are cross-sectional views schematically illustrating a modification of a light emitting device package according to an example embodiment. Specifically, FIG. 8A is a cross-sectional view illustrating a region including a region taken along line I-I' of FIG. 7 and FIG. 8B is a cross-sectional view illustrating a region including a region taken along line II-II' of FIG. 7.

Referring to FIGS. 7, 8A and 8B, according to an example embodiment, a light emitting device package 10' may include the submount 40c described above with reference to FIG. 7. The light emitting device package 10' may include the package body 15, the cover 25, the first and second package pads 30a and 30b, the first and second lower electrodes 33a and 33b, and first and second connection patterns 36a and 36b.

The submount 40c may be disposed on the first and second lower electrodes 33a and 33b of the package substrate 18 of the package body 15 as illustrated in FIGS. 1 through 4. As described above with reference to FIGS. 1 through 4, the adhesive member 38 adhered to the lower surface 40L of the submount 40c may be interposed between the submount 40 and the first and second lower electrodes 33a and 33b so as to fix or adhere the submount 40 to the first and second lower electrodes 33a and 33b.

The insulating layer 60 may be on the upper surface 40U of the submount 40c. In an example, the insulating layer 60 may the central region 42 of the submount 40c and extend to the sloped region 44' and further extend to the upper end portions 146a, 146b, 146c, 146d, and the first and second base regions 46a' and 46' (in an overlapping manner). First and second electrode layers 165a and 165b may be disposed on the insulating layer 60 and may be spaced apart from each other.

The first and second electrode layers 165a and 165a cover a portion of the central region 42 of the submount 40c, may extend onto the sloped regions 44', and may further extend onto the upper end portions 146a, 146b, 146c, and 146d. Among the first and second electrode layers 165a and 165b, the first electrode layer 165a may extend onto the first base region 46a' and the second electrode layer 165b may extend onto the second base region 46b'. Likewise as in FIGS. 1 through 4, the light emitting device chip 50 may be disposed in the central region 42, the first chip pads 53a may be disposed between the light emitting device chip 50 and the first electrode layer 165a, and the second chip pad 53b may be disposed between the light emitting device chip 50 and the second electrode layer 165b.

A first reflective layer 70a' may be disposed on the first electrode layer 165a and a second reflective layer 70b' may be disposed on the second electrode layer 165b. The first and second reflective layers 70a' and 70b' may be spaced apart from each other. The first and second reflective layers 70a' and 70b' may overlap the sloped region 44'.

In an example, the first and second reflective layers 70a' and 70b' extend onto the central region 42 on the sloped region 44' to overlap a portion of the central region 42. In an example, the first and second reflective layers 70a' and 70b' may extend, on the sloped regions 44', to the upper end portions 146a, 146b, 146c, and 146d to overlap the upper end portions 146a, 146b, 146c, and 146d.

A first bonding wire 75a connecting the first electrode layer 165a and the first lower electrode 33a and a second bonding wire 75b connecting the second electrode layer 165b and the second lower electrode 33b may be disposed.

Likewise as in FIG. 1, the first bonding wire 75a may electrically connect a contact region of the first lower electrode 33a extending from a region interposed between the submount 40c and the package substrate 18 and an upper contact region of the first electrode layer 165a extending from a portion interposed between the first reflective layer 70a' and the submount 40c in a direction of the side portion 21. Likewise as in FIG. 1, the second bonding wire 75b may electrically connect a contact region of the second lower electrode 33b extending from a region interposed between the submount 40c and the package substrate 18 and an upper contact region of the second electrode layer 165b extending from a portion interposed between the second reflective layer 70b' and the submount 40c in a direction of the side portion 21.

Like the submount 40 described above with reference to FIGS. 1 through 4, the submount 40c may improve heat dissipation efficiency of the light emitting device package 10, and like the first and second electrode layers 65a and 65b described above with reference to FIGS. 1 through 4, the first and second electrodes 165a and 165b may improve electrical characteristics of the light emitting device package 10. Also, like the first and second reflective layers 70a and 70b described above with reference to FIGS. 1 through 4, the first and second reflective layers 70a' and 70b' may improve light extraction efficiency of the light emitting device package 10'.

As described above, according to the example embodiments the light emitting device packages 10 and 10' capable of improving efficiency of extracting light of the ultraviolet ray region and heat dissipation efficiency may be provided.

As set forth above, according to the example embodiments, the light emitting device package including the submount formed on the package substrate and having the sloped region, and the electrode layers, the reflective layers, and the light emitting device chip disposed on the submount may be provided. The reflective layers overlapping the sloped regions may increase extraction efficiency of light emitted from the light emitting device chip. Also, the submount may serve to dissipate heat generated by the light emitting device chip. Thus, the light emitting device package with increased heat dissipation and light extraction efficiency may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting device package, comprising:
a package substrate;
a submount on the package substrate, wherein an upper surface of the submount includes a central region, a first base region, and a second base region, the first and second base regions being spaced from the package substrate, relative to the central region, and a sloped region between the central region and the first and second base regions;
a light emitting device chip in the central region;
a first electrode layer between the central region and the light emitting device chip, the first electrode layer extending from under the light emitting device chip onto the sloped region and the first base region;
a second electrode layer between the central region and the light emitting device chip, the second electrode layer extending from under the light emitting device chip onto the sloped region and the second base region, and spaced apart from the first electrode layer;
a first reflective layer on the first electrode layer and overlapping the sloped region;
a second reflective layer on the second electrode layer and overlapping the sloped region;
first and second lower electrodes on the package substrate and spaced apart from each other; and
an adhesive member between the submount and the first and second lower electrodes, the adhesive member fix the submount to the first and second lower electrodes and to insulate the submount from the first and second lower electrodes,
wherein:
the first lower electrode includes a first lower contact region extending from a region between the submount and the package substrate,
the second lower electrode includes a second lower contact region extending from a region between the submount and the package substrate,
the first electrode layer includes a first upper contact region extending from a region between the submount and the first reflective layer, and
the second electrode layer includes a second upper contact region extending from a region between the submount and the second reflective layer.

2. The light emitting device package as claimed in claim 1, wherein the central region and the first and second base regions are parallel to an upper surface of the package substrate.

3. The light emitting device package as claimed in claim 2, wherein the sloped region surrounds the central region.

4. The light emitting device package as claimed in claim 1, further comprising an insulating layer between the first and second electrode layers and the submount, the insulating layer separating the first and second electrode layers from the submount.

5. The light emitting device package as claimed in claim 1, further comprising:
a first chip pad between the light emitting device chip and the first electrode layer; and
a second chip pad between the light emitting device chip and the second electrode layer.

6. The light emitting device package as claimed in claim 1, further comprising:
a side portion extending from an edge region of the package substrate; and
a cover covering the side portion,
wherein the submount and the light emitting device chip are in a space between the cover and the package substrate.

7. The light emitting device package as claimed in claim 1, further comprising:
a first bonding wire connecting the first lower electrode and the first electrode layer; and
a second bonding wire connecting the second lower electrode and the second electrode layer,
wherein
the first bonding wire electrically connects the first lower contact region and the first upper contact region, and
the second bonding wire electrically connects the second lower contact region and the second upper contact region.

8. The light emitting device package as claimed in claim 1, further comprising:
first and second package pads spaced apart from each other on a lower surface of the package substrate;
a first connection pattern electrically connecting the first package pad and the first lower electrode through the package substrate; and
a second connection pattern electrically connecting the second package pad and the second lower electrode through the package substrate.

9. The light emitting device package as claimed claim 1, wherein
the submount includes upper end portions that are coplanar, and
the first and second base regions are part of the upper end portions.

10. The light emitting device package as claimed in claim 1, wherein
the submount includes upper end portions that are coplanar,
portions of the upper end portions includes recess regions, and
the first and second base regions are bottom regions of the recess regions.

11. A light emitting device package, comprising:
a package body including a package substrate and a side portion extending from an edge region of the package substrate;
a submount on the package substrate, wherein an upper surface of the submount includes a central region, a sloped region extending from the central region and surrounding the central region, and first and second base regions extending from the sloped region towards the side portion and away from the central region;
a light emitting device chip in the central region;
a first electrode layer between the central region and the light emitting device chip, the first electrode layer extending from under the light emitting device chip onto the sloped region and the first base region;
a second electrode layer between the central region and the light emitting device chip, the second electrode layer extending from under the light emitting device chip onto the sloped region and the second base region, and spaced apart from the first electrode layer;
a first reflective layer on the first electrode layer and overlapping the sloped region, wherein the first electrode layer includes a first upper contact region extending from a portion between the first reflective layer and the submount towards the side portion;
a second reflective layer on the second electrode layer and overlapping the sloped region, wherein the second electrode layer includes a second upper contact region extending from a portion between the second reflective layer and the submount towards the side portion and away from the central region;
a first bonding wire in contact with the first upper contact region;
a second bonding wire in contact with the second upper contact region;

first and second lower electrodes in upper portions of the package substrate and spaced apart from each other;

an insulating layer on an upper surface of the submount and separating the first and second electrode layers and the submount; and an adhesive member between the submount and the first and second lower electrodes, the adhesive member to fix the submount to the first and second lower electrodes and to separate the submount from the first and second lower electrodes, wherein:

the first lower electrode includes a first lower contact region extending from a region between the submount and the package substrate, the second lower electrode includes a second lower contact region extending from a region between the submount and the package substrate, the first bonding wire extends from a portion in contact with the first upper contact region to contact the first lower contact region, and the second bonding wire extends from a portion in contact with the second upper contact region to contact the second lower contact region.

\* \* \* \* \*